(12) United States Patent
Shen

(10) Patent No.: US 11,150,280 B2
(45) Date of Patent: Oct. 19, 2021

(54) APPARATUS AND METHOD FOR CURRENT MEASUREMENT

(71) Applicant: Analog Devices, Inc., Norwood, MA (US)

(72) Inventor: Junhua Shen, Wilmington, MA (US)

(73) Assignee: Analog Devices, Inc., Norwood, MA (US)

(*) Notice: Subject to any disclaimer, the term of this patent is extended or adjusted under 35 U.S.C. 154(b) by 59 days.

(21) Appl. No.: 16/285,046

(22) Filed: Feb. 25, 2019

(65) Prior Publication Data

US 2020/0271701 A1 Aug. 27, 2020

(51) Int. Cl.
*G01R 19/00* (2006.01)
*G01R 19/25* (2006.01)
(Continued)

(52) U.S. Cl.
CPC ..... *G01R 19/2506* (2013.01); *G01R 19/0038* (2013.01); *G01R 31/50* (2020.01); *H03K 5/24* (2013.01)

(58) Field of Classification Search
CPC ............ G01R 19/2506; G01R 19/0038; G01R 31/50; G01R 31/52; H03K 5/24
See application file for complete search history.

(56) References Cited

U.S. PATENT DOCUMENTS 5,159,516 A * 10/1992 Fujihira ........... G01R 19/16552
323/315
5,673,165 A 9/1997 Kuehn et al.
(Continued)

FOREIGN PATENT DOCUMENTS

CN 101839936 A 9/2010
CN 103683932 A 3/2014
(Continued)

OTHER PUBLICATIONS

"INA20x High-Side Measurement Current-Shunt Monitor With Open-Drain Comparator and Reference", Texas Instruments Data Sheet, (Sep. 2017), 35 pgs.

*Primary Examiner* — Patrick Assouad
*Assistant Examiner* — Demetrius R Pretlow
(74) *Attorney, Agent, or Firm* — Schwegman Lundberg & Woessner, P.A.

(57) ABSTRACT

A current measurement circuit may use a probabilistic technique to determine a current from a circuit block. In one embodiment, the circuit includes a comparator circuit, a first current sensing element (such as a first resistor), and a control circuit. The first current sensing element is coupled to the comparator circuit to establish a first comparator input signal representative of the current at an input of the comparator circuit. The control circuit is coupled to the comparator circuit to obtain a first plurality of comparator output decisions corresponding to the first current sensing element for a specified count, determine a first proportion of comparator output decisions meeting a specified criterion, and determine a voltage value of the first comparator input signal from the first proportion. The control circuit is configured to determine a current value using the voltage value of the first comparator input signal and an impedance value of the first current sensing element. The current measurement circuit is relatively low-cost and easy to implement, without requiring a precision reference voltage, current, and/or high-cost analog-to-digital converters (ADCs).

26 Claims, 3 Drawing Sheets

(51) Int. Cl.
  *H03K 5/24* (2006.01)
  *G01R 31/50* (2020.01)

(56) References Cited

U.S. PATENT DOCUMENTS

| | | |
|---|---|---|
| 6,242,891 B1 | 6/2001 | Parsonage |
| 7,397,678 B2 | 7/2008 | Frank et al. |
| 7,522,397 B2 | 4/2009 | Filippo et al. |
| 7,526,390 B2* | 4/2009 | Kajita .............. G01R 19/16552 |
| | | 702/182 |
| 8,624,610 B2 | 1/2014 | Neidorff |
| 10,303,234 B2* | 5/2019 | Gailhard ................... H02H 1/06 |
| 2004/0018419 A1* | 1/2004 | Sugimoto ............. H01M 10/48 |
| | | 429/61 |
| 2007/0145981 A1 | 6/2007 | Tomita et al. |
| 2008/0303527 A1* | 12/2008 | Fechalos .............. G01R 31/382 |
| | | 324/426 |
| 2009/0222227 A1* | 9/2009 | Gonano ................. G01R 31/50 |
| | | 702/66 |
| 2012/0116701 A1* | 5/2012 | Yuasa ................... H01M 10/48 |
| | | 702/63 |
| 2014/0354266 A1 | 12/2014 | Hurwitz et al. |
| 2018/0219557 A1 | 8/2018 | Dastgheib et al. |
| 2019/0079117 A1* | 3/2019 | Hurwitz ............... G01R 15/146 |
| 2019/0173272 A1* | 6/2019 | Yoon ....................... G01R 31/52 |

FOREIGN PATENT DOCUMENTS

| | | |
|---|---|---|
| CN | 205544928 U | 8/2016 |
| DE | 4124187 C1 | 11/1992 |

* cited by examiner

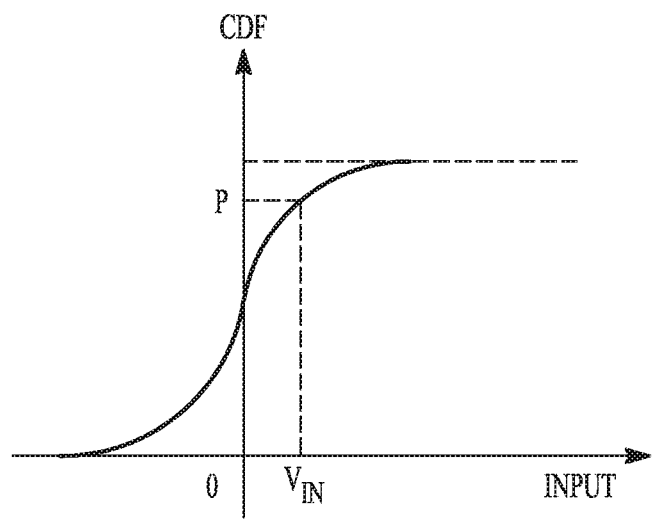
FIG. 4
| P | $V_{IN}$ (mV) |
|---|---|
| 0.77 | 0.6 |
| 0.92 | 1.1 |
FIG. 5
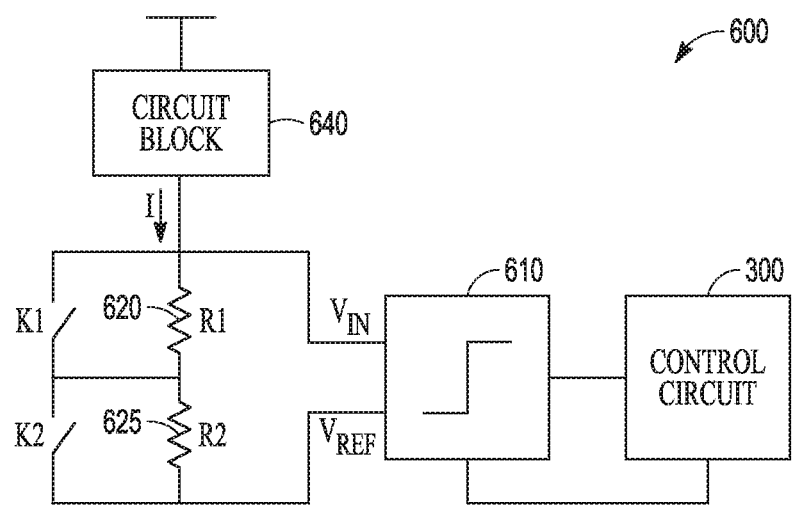
FIG. 6

APPARATUS AND METHOD FOR CURRENT MEASUREMENT

TECHNICAL FIELD

This document pertains generally, but not by way of limitation, to current measurement, and as an example, but not by way of limitation, to leakage current measurement.

BACKGROUND

Various techniques may be used to measure a leakage current associated with an electronic circuit. In some circumstances, a leakage current associated with a circuit may indicate an undesirable level of power consumption. Leakage current measurement associated with the circuit may be used to help adjust the circuit to reduce power consumption, optimize circuit performance, or to screen such circuits such as in a test environment during or after production.

SUMMARY

A statistical approach may be used to measure a current associated with an electronic circuit. For example, apparatus and techniques described herein may be used to evaluate a current (e.g., a leakage current or other current) of a circuit under test. Information about the measured current may be used to adjust circuit operation or to otherwise adjust circuit parameters, such as to limit the measured current to a specified value. The present inventor has recognized, among other things, that apparatus and techniques such as shown and described herein may provide an approach that decreases a current measurement complexity as compared to other approaches. For example, the apparatus for performing the statistical approach need not rely on precision measurement circuitry, such as not requiring a high-resolution digitizer or analog-to-digital converter.

Embodiments of the application may provide a method of measuring a current associated with a circuit block using a probabilistic technique and a comparator circuit. The method may comprise establishing an input signal representative of the current at an input to the comparator circuit; using the comparator circuit, comparing the input signal to a specified reference and obtaining a plurality of comparator output decisions corresponding to a specified count of trials; determining a proportion of comparator output decisions meeting a specified criterion; determining a voltage value of the input signal from the proportion, the voltage value corresponding to the current; and determining a value of the current based on the voltage value.

Embodiments of the application may provide a current measurement circuit arranged to use a probabilistic technique to determine a current. The current measurement circuit may comprising a comparator means for comparing an input signal to a specified reference and obtaining a plurality of comparator output decisions corresponding to a specified count of trials; a first current sensing circuit means for establishing the input signal representative of a current at an input to a comparator means; a means for determining a proportion of comparator output decisions meeting a specified criterion and for determining a voltage value of the input signal from the proportion, the voltage value corresponding to the current; and a means for determining a value of the current based on the voltage value.

Embodiments of the application may provide a current measurement circuit that is arranged to use a probabilistic technique to determine a current of a circuit block. The current measurement circuit may comprise a comparator circuit; a first current sensing element coupled to the comparator circuit, the first current sensing element arranged to establish a first comparator input signal representative of the current at an input of the comparator circuit; and a control circuit coupled to the comparator circuit. The control circuit may be configured to obtain a first plurality of comparator output decisions corresponding to the first current sensing element for a specified count, determine a first proportion of comparator output decisions meeting a specified criterion, and determine a voltage value of the first comparator input signal from the first proportion, the voltage value of the first comparator input signal corresponding to the current. A value of the current is determined based on the voltage value.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4 shows an example of a cumulative distribution function of Gaussian noise of a comparator according to an embodiment.

FIG. 5 shows an example of a look-up-table illustrating the relationship between probability values of output decisions of a comparator being ones and comparator input voltages according to an embodiment.

FIG. 6 shows another example of a leakage current measurement circuit arranged to use a probabilistic technique and a comparator to determine a leakage current according to another embodiment.

DETAILED DESCRIPTION

Embodiments of the application may provide a leakage current measurement circuit that is arranged to use a probabilistic or statistical technique and a comparator circuit to determine a leakage current (like a leakage current) of a circuit block.

Embodiments of the application may also provide a method of measuring a leakage current (like a leakage current) of a circuit block using a probabilistic or statistical technique and a comparator circuit.

Figure 1:
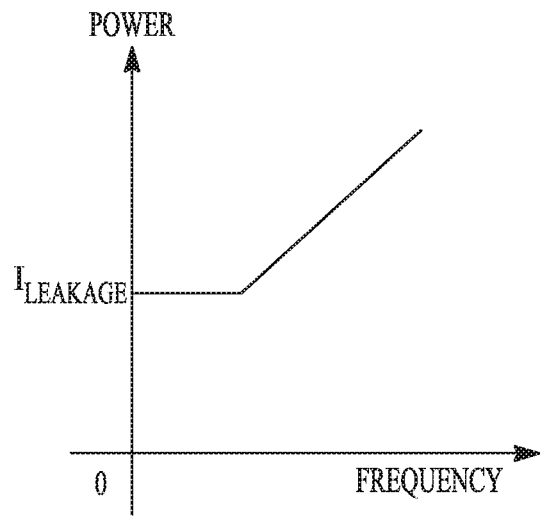
FIG. 1 shows an illustrative example where a circuit power consumption is dominated by a leakage current at low operating frequency.

FIG. 1 shows an example where a circuit power consumption is dominated by a leakage current at low operating frequency. In advanced integrated circuit processes (e.g., complementary metal-oxide-semiconductor or CMOS processes), for example, a leakage current may become a concern across different devices as it may dominate both analog and digital power consumptions, especially when an integrated circuit (IC) is running at low operating frequency where dynamic current may become negligible. At low operating frequency, a small increase of the leakage current may cause a large increase of power consumption. A low-cost way of measuring the leakage current on a chip, for example, may be used to adjust certain circuit parameters (either during operation, during fabrication, or at another phase). For example, circuit parameters may be adjusted to reduce a leakage current when the chip is operating or otherwise representative of a "faster" corner of the operating or processing envelope, or to increase the leakage current to allow faster operation when the chip is in comparatively "slower" corner. In this manner, data indicative of the leakage current may be used to help reduce both analog and digital power consumptions, or improve circuit performance. The operational parameters that may be adjusted include a supply voltage level or a transistor body bias voltage level, as illustrative examples.

Figure 2:
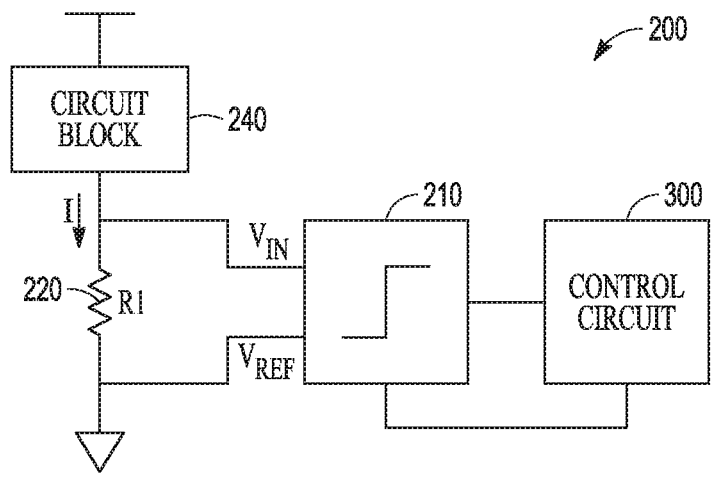
FIG. 2 shows an example of a leakage current measurement circuit arranged to use a probabilistic technique and a comparator to determine a leakage current according to an embodiment.

FIG. 2 shows an example of a leakage current measurement circuit 200 that is arranged to use a probabilistic or statistical technique to determine a leakage current of a circuit block according to an embodiment. The embodiments of the application describe a way of determining a leakage current without the need of an explicit reference voltage or a high cost analog-to-digital converter (ADC).

In some embodiments, the leakage current measurement circuit 200 may include a comparator circuit 210, a first current sensing element 220 coupled to the comparator circuit 210, and a control circuit 300 coupled to the comparator circuit 210. The leakage current measurement circuit 200 may use a probabilistic technique and the comparator circuit 210 to determine a leakage current. The leakage current may be, but not limited to, a leakage current, "I" that corresponds to a circuit block 240, for example.

Figure 3:
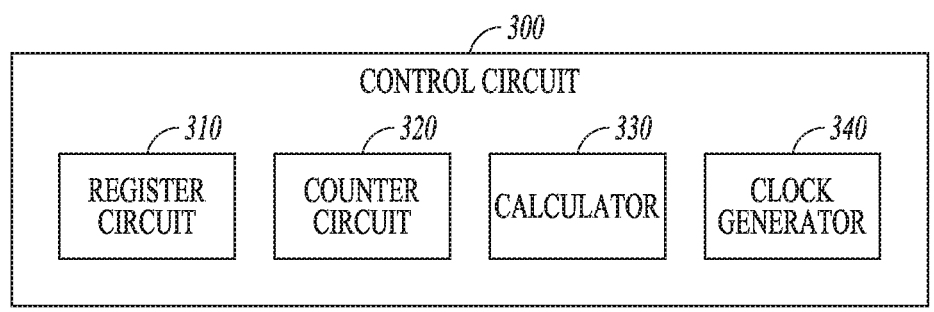
FIG. 3 shows an example of a control circuit in a leakage current measurement circuit according to an embodiment.

The comparator circuit 210 may be a low-cost noisy comparator with a noise level, "Vn", (e.g., 0.8 mV, according to an illustrative example). The comparator circuit 210 includes a signal input, a reference input, and an output. In some embodiments, the comparator 210 may obtain clock inputs e.g., from a clock generator, which may locate in a control circuit 300 as shown in FIG. 3. In each clock period, a comparator decision may be made.

The comparator 210 may obtain a comparator input voltage, "Vin," at the signal input. The comparator input voltage Vin may be established by the first current sensing element 220 in response to the current passing through the first current sensing element 220. The comparator 210 may obtain a reference voltage, "Vref", at a reference input. In some embodiments, the reference input of the comparator 210 may be grounded, and thus the reference voltage Vref may be zero. The comparator 210 may output a digital decision, "Dout" at the output based on a comparison between the comparator input voltage Vin and the reference voltage Vref. When the comparator input voltage Vin is greater than the reference voltage Vref, the digital output Dout is asserted (e.g., corresponding to binary "one" value, for example). Otherwise, when the comparator input voltage Vin is less than the reference voltage Vref, the digital output Dout is de-asserted.

The comparator circuit 210 is powered up or otherwise enabled by the control circuit 300 only when the current measurement is active (for example, during the current measurement).

Even though the current measurement circuit 200 in FIG. 2 is illustrated to include one comparator circuit 210 for example, the measurement circuit of the disclosure is not limited to include only one comparator circuit. For example, the current measurement circuit may include multiple (e.g., 10) comparator circuits (not shown in the figures) arranged in parallel each other. Each comparator circuit of the multiple comparators may obtain a comparator input voltage at a signal input and obtain a reference voltage at a reference input from the first current sensing element, for example. In this way, the multiple comparator circuits may do comparisons simultaneously between the comparator input voltage and the reference voltage of each comparator circuit so as to make the comparisons more time-efficient.

The first current sensing element 220 is coupled to the comparator circuit 210. In some embodiments, the first current sensing element 220 may be coupled between the circuit block 240 and a reference node (e.g., ground) for example. The first current sensing element 220 may be arranged to establish a first comparator input signal representative of the leakage current at the signal input of the comparator circuit 210 due to a leakage current, I, passing through the first current sensing element 220. In some embodiments, the first current sensing element 220 may be a first resistor, "R1" with a resistance value, "R." For example, the first current sensing element 220 may establish a first comparator input voltage Vin at the signal input of the comparator 210.

In some embodiments, a first voltage that is established at a first end of the first current sensing element 220 may be used as the input voltage Vin to the comparator circuit 210, and a second voltage that is established at a second end of the first current sensing element 220 may be used as the reference voltage Vref of the comparator circuit 210.

In some embodiments, under the control of the control circuit 300, the comparator circuit 210 may do a specified count (e.g., 100) of comparisons between the first comparator input voltage Vin at the signal input of the comparator 210 and the reference voltage Vref at the reference input of the comparator 210. In some embodiments, the Vref of the comparator 210 may be zero. Supposed that the first comparator input voltage Vin is on a similar order of the noise level Vn (e.g., 0.8 mV) of the comparator 210, after completion of the specified count of comparisons by the comparator 210 between the first comparator input voltage Vin and the reference voltage Vref (e.g., 0 mV), a proportion (or probability) value P of the output decisions of the comparator 210 being ones may be determined by a control circuit 300, which will be described with reference to FIG. 3.

FIG. 3 shows an example of a control circuit 300 in the leakage current measurement circuit as shown in FIG. 2. In some embodiments, the control circuit 300 may command or instruct the comparator 210 to perform a specified count (e.g., 100) of comparisons for a leakage current measurement.

The control circuit 300 may include a register circuit 310 to record a plurality of comparator output decisions (ones or zeroes) corresponding to the specified count of comparisons made by the comparator 210 during the leakage current measurement.

The control circuit 300 may include a counter circuit 320 to count the number of the comparator output decisions meeting a specified criterion (e.g., a proportion of decisions being ones or zeroes) corresponding to the specified count of comparisons (e.g., 100) made by the comparator circuit 210 during the leakage current measurement. In some embodiments, the specified criterion may be that the comparator output decisions made by the comparator circuit 210 are ones. In other embodiments, the specified criterion may alternatively be that the comparator output decisions made by the comparator circuit 210 are zeroes.

The control circuit 300 may include a calculator 330 to calculate a proportion value P of comparator output decisions meeting the specified criterion (e.g., the comparator output decisions being ones) based on the number of the comparator output decisions meeting the specified criterion for the specified count of comparisons. For example, supposed that the specified criterion is that the comparator output decisions made by the comparator circuit 210 are ones, the specified count of comparisons is 100, and the number of the comparator output decisions meeting the specified criterion is determined to be 77, then the proportion value P of comparator output decisions meeting the specified criterion will be determined to be 0.77.

With the determined proportion value P of comparator output decisions meeting the specified criterion, the value of the first comparator input voltage Vin may be determined using a probabilistic or statistical technique. For example, a cumulative distribution function of Gaussian noise of a comparator as shown in FIG. 4 or a look-up-table of a comparator as shown in FIG. 5 may be used to determine the value of the first comparator input voltage Vin based on the proportion value P of comparator output decisions meeting the specified criterion.

The control circuit 300 may also include a clock generator 340 configured to generate clock signals to control the comparator 210. For example, the comparator 210 may obtain the clock signals generated by the clock generator 340 as clock inputs to control comparison operations so that in each clock period a comparator decision may be made.

FIG. 4 shows an example of a cumulative distribution function (CDF) 400 of Gaussian noise of a comparator, which illustrates the relationship between proportion values of output decisions being ones of the comparator and values of comparator input voltages Vin of a comparator at a noise level Vn.

Typically, a noise level Vn of a comparator follows a normal distribution. For example, the CDF 400 of the comparator 210 at the noise level Vn may provide a probabilistic or statistical way to determine a value of a first comparator input voltage Vin from a determined proportion value P of the output decisions of the comparator 210 being ones. For example, by using a CDF 400 at a noise level Vn of 0.8 mV, supposed that the proportion value P of the output decisions of the comparator 210 being ones is determined to be 0.77, the value of the first comparator input voltage Vin may be determined to be 0.6 mV.

FIG. 5 shows an example of a look-up-table (LUT) 500 that illustrates a relationship between proportion values of output decisions of a comparator being ones and values of comparator input voltages Vin. The LUT 500 may provide another way to probabilistically or statistically obtain a value of the first comparator input voltage yin from the determined proportion value P.

The LUT 500 may include a specified count of rows of data that show a corresponding mapping relationship between proportion values P of the output decisions of the comparator 210 being ones and values of the first comparator input voltages Vin for example. The specified count of rows may be established at least in part in response to a desired precision of the current measurement. As an illustrative example, P1=0.77 maps Vin1=0.6 mV, and P2=0.92 maps Vin2=1.1 mV, and so on. The LUT 500 may have been created through a large number of experiments or tests (e.g., empirically) by using the comparator 210 (or other ways) to determine the proportion values P of the output decisions of the comparator 210 being ones and measuring the corresponding values of the first comparator input voltages Vin.

By using the LUT 500 having a noise level Vn (e.g., 0.8 mV), supposed that a proportion value P (e.g., 0.77) of the output decisions of the comparator 210 being ones for a specified count (e.g., 100) of comparisons is determined, the value (e.g., 0.6 mV) of the first comparator input voltage Vin may be obtained quickly at low cost and without requiring a precision analog-to-digital converter.

With the determined value (e.g., 0.6 mV) of the first comparator input voltage Vin, the control circuit 300 may determine a value of the leakage current, I, as a function of the value of the first comparator input voltage Vin and an impedance value of the first current sensing element. In some embodiments, the first current sensing element 220 may be a resistor R1 with a known resistance value R. The calculator 300 may determine a value of the leakage current using a formula, I=Vin/R. For example, based on this formula, if Vin=0.6 mV, and R=0.5 kohm, then the value of the leakage current I may be determined as I=0.6 mV/0.5 kohm, that is 1.1 μA.

FIG. 6 shows another example of a leakage current measurement circuit 600 that is arranged to use a probabilistic technique to determine a leakage current according to another embodiment. The leakage current measurement circuit 600 may include a comparator circuit 610, where the comparator may have finite input referred offset, a first current sensing element 620 and a second current sensing element 625, and a control circuit 300 (as shown in FIG. 3) coupled to the comparator circuit 610.

Similar to the comparator circuit 210 as shown in FIG. 2, the comparator circuit 610 may be a low-cost (e.g., "noisy") comparator with a noise level represented by Vn. The comparator circuit 610 may include a signal input, a reference input, and an output. The comparator 610 may obtain a comparator input voltage Vin at the signal input. The comparator 610 may obtain a reference voltage Vref at the reference input. The comparator 610 may output a digital decision Dow at the output based on a comparison between the comparator input voltage Vin and the reference voltage Vref. When the comparator input voltage Vin is greater than the reference voltage Vref, the digital output Dout is supposed to be 1. Otherwise, when the comparator input voltage Vin is less than the reference voltage Vref, the digital output Dout is supposed to be 0. The comparator circuit 610 is set ON by the control circuit 300 only when the current measurement is active (for example, when performing the current measurement).

As shown in FIG. 6, the first current sensing element 620 and the second current sensing element 625 are coupled in series to a circuit block 640 to measure a leakage current (e.g., a leakage current from the circuit block 640). For example, the first current sensing element 620 and the second current sensing element 625 may be coupled in series between the circuit block 640 and a reference node (e.g., ground). In some embodiments, the first current sensing element 620 may be a first resistor with a first resistance value R1, and the second current sensing element 625 may be a second resistor with a second resistance value R2. As shown in FIG. 6, the leakage current measurement circuit 600 also includes a first switch K1 and a second switch K2 that are arranged to switch the leakage current through the first current sensing element 620 or the second current sensing element 625, for example.

For example, when the first switch K1 is set OFF and the second switch K2 is set ON, the leakage current is switched through the first current sensing element 620, and thus create a first comparator input signal that may be input to the comparator 610. Otherwise, when the first switch K1 is set ON and the second switch K2 is set OFF, the leakage current is switched through the second current sensing element 625, and thus creates a different second comparator input signal that may be input to the comparator 610. In some embodiments, the first comparator input signal may be a first comparator input voltage Vin1, and the second comparator input signal may be a second comparator input voltage Vint.

Although only two current sensing elements (e.g., the first current sensing element 620 and the second current sensing element 625) are shown in the leakage current measurement circuit 600 in FIG. 6, the leakage current measurement circuit may include more than two current sensing elements. For example, the leakage current measurement circuit may include five current sensing elements and five switches such that the leakage current can be switched through a specific current sensing element of the five current sensing elements. The current sensing elements may be arranged on a ground side or a supply voltage (VDD) side.

While the first comparator input voltage Vin1 is applied to the comparator 610, the control circuit 300 may command the comparator circuit 610 to do a specified count (e.g., 100) of comparisons between the first comparator input voltage Vin1 and the reference voltage Vref. In an illustrative example, the Vin1 value provided to the comparator 610 may have a value similar to, or otherwise on the order of the noise level Vn of the comparator 610, after completion of the specified count of comparisons done by the comparator 610 between the Vin1 and the Vref, a first proportion value P1 may represent a proportion of the output decisions of the comparator 610 being ones may be determined by the control circuit 300.

In this example, the second comparator input voltage Vin2 is applied to the comparator 610, the control circuit 300 may command the comparator circuit 610 to do the specified count (e.g., 100) of comparisons between the second comparator input voltage Vin2 and the reference voltage Vref. In this illustrative example, the Vin2 value provided to the comparator 610 may also be similar to, or otherwise on the order of the noise level Vn of the comparator 610. After completion of the specified count of comparisons by the comparator 610 between the Vin2 and the Vref, a second proportion value P2 of the output decisions of the comparator 610 being ones may be determined by the control circuit 300.

In some embodiments, with the first proportion value P1, a value of the voltage Vin1 of the first comparator input signal is determined from the first proportion value P1 by using the CDF 400 having a noise level Vn as described above. And, with the second proportion value P2, a value of the voltage Vin2 of the second comparator input signal is determined from the second proportion value P2 by using the CDF 400 having a noise level Vn as described above. For example, by using the CDF 400 having a noise level Vn of 0.8 mV, supposed it is determined that P1=0.77, P2=0.92, then Vin1 and Vin2 may be determined as Vin1=0.6 mV, and Vin2=1.1 mV.

In some embodiments, with the determined first proportion value P1 of the output decisions of the comparator 610 being ones, a value of the Vin1 of the first comparator input signal may be determined by the LUT 500 as described above. With the determined second proportion value P2 of the output decisions of the comparator 610 being ones, a value of the Vin2 of the second comparator input signal may be determined by the LUT 500 as described above. For example, by using the LUT 500, supposed that it is determined that P1=0.77, and P2=0.92, then the values of the Vin1 and the Vin2 may be determined as Vin1=0.6 mV, and Vin2=1.1 mV. Finally, with the determined values of the Vin1 and the Vin2, and the known values of the R1 and the R2, the leakage current of the circuit block 640 may be determined even in the presence of finite comparator offset.

An example of determining the leakage current by using a probabilistic technique and a comparator circuit 610 as shown in FIG. 6 is given below. The comparator 610 as shown in FIG. 6 may have an input-referred offset, represented as "Vos," and the leakage current to be measured (e.g., a leakage current from a circuit block 640) is I, as in other examples. The values of the Vos and the I may be unknown. The noise level Vn may represent the comparator noise and the values may be known, such as experimentally determined or determined via simulation. The first resistance R1 (e.g., 0.5 kohm) and the second resistance R2 (e.g., 1 kohm) of the first current sensing element 620 and the second current sensing element 625 are known, and such values may only vary ~+/−30% across all process, voltage, and temperature (PVT) corners, according to an illustrative example. Even if such variation seems significant, such variation may be considered negligible compared to leakage current variation, which could vary more than 100 times across various corner cases. The current measurement circuit 600 has two switches K1 and K2, which may be switched to produce at least two non-zero voltage values Vin1 and Vin2 to be used as comparator input voltages, for example.

$$Vin1 = I*R1(K1\text{ off}, K2\text{ on}) \quad (1)$$

$$Vin2 = I*R2(K1\text{ on}, K2\text{ off}) \quad (2)$$

When measuring the comparator input voltages, the noisy comparator 610 may obtain a specified count of comparisons to provide a count of output decisions as described earlier.

$$I*R1 + Vos = f(Vn, P1) \quad (3)$$

$$I*R2 + Vos = f(Vn, P2) \quad (4)$$

Corresponding to equations (1)-(2), a comparator input referred offset Vos is also taken into account. In equations (3)-(4), f(Vn, P) denotes a value as a function of the comparator noise Vn and a proportion value P of decisions of the comparator 610 being ones, for example.

$$Vin = f(Vn, P) = Vn*\text{sqrt}(2)*\text{erfinv}(2*P-1) \quad (5)$$

f(Vn, P) is an inverse CDF function (e.g., an inverse error function in this example) to derive a comparator input voltage Vin given the proportion value P of decisions of the comparator 610 being ones. Now equation (3)-(4) become:

$$I*R1 + Vos = Vin1 \quad (6)$$

$$I*R2 + Vos = Vin2 \quad (7)$$

Where the values of the Vin1 and the Vin2 are obtained from the CDF 400 or from the LUT 500 for two measurements respectively. In one approach, the value of the Vin may be determined based on the proportion value P by using the CDF 400 as shown in FIG. 4. In another approach, the value of the Vin may be determined based on the proportion value P by using the LIT 500 as shown in FIG.

Here, in equations (6)-(7), only two unknown values, I and Vos, are left. Therefore, the value of the leakage current I may be solved as shown below:

$$I = (Vin1 - Vin2)/(R1 - R2) \quad (8)$$

For example, R1 is selected to be 0.5 kohm, R2 is selected to be 1 kohm, and a comparator 610 having a noise voltage level Vn of 0.8 mV is used to do two schemes of measurements in order to determine the values of the Vin1 and the Vin2. In a first measurement scheme, the switch K1 is set OFF and the switch K2 is set ON, and thus the Vin1 may be established. In a second measurement scheme, the switch K1 is set ON and the switch K2 is set OFF, and thus Vin2 may be established. P1 and P2 are respectively determined to be 0.77 and 0.92 by using the schemes as described above by respectively doing a specified count of comparisons (e.g., 100 times for each of the measurement schemes).

The values of the Vin1 and the Vin2 then may be respectively determined using equation (5) to be ~0.6 mV and ~1.1 mV. Alternatively, the values of the Vin1 and the Vin2 may also be respectively determined by using the LUT 500 as shown in FIG. 5 to be ~0.6 mV and ~1.1 mV.

Finally, by using equation (8), the value of the leakage current I may be determined. For example, a calculator of the control circuit 300 may determine the value of the leakage current I to be (0.6 mV−1.1 mV)/(0.5 kohm−1 kohm)=~1 µA.

In this example, the statistical current measurement (SCM) circuit involves a noisy comparator, two resistors, two switches, a circuit for determining the CDF (or a small LUT), and a calculator to perform simple calculations (such as addition, subtraction, multiplication, and division) for example. The extra circuits may be powered off when not in use. In a case where the offset of the comparator is too great in magnitude to make the statistical measurement effective, a coarse power-up offset calibration or auto-zeroing may be applied, so that the offset is calibrated out or otherwise reduced.

The current measurement approach described herein may not provide absolute accuracy across all corners. For example, the comparator noise level Vn, or the resistance values of resistors R1 and R2 may deviate across corners, as illustrative examples. However, as mentioned above, when measuring a circuit leakage current, the measurement techniques and apparatus described herein may be used to obtain information indicative of leakage current, and particularly of variation in leakage current across devices or across different operational conditions. This data may then be used to adjust circuit parameters such as transistor body bias, or supply level to reduce the variation in leakage values from a 100-to-1 range of variation, to within a 2-to-1 range of variation, as an illustrative example. In this manner, the apparatus and techniques described herein may provide a relatively simple and low-cost current measurement technique that does not require an ADC or precision reference voltage in order to measure the leakage current (e.g., leakage current). The approaches described herein may also reduce an impact of the input-referred offset Vos of the comparator on the accuracy of the current measurement.

Figure 7:
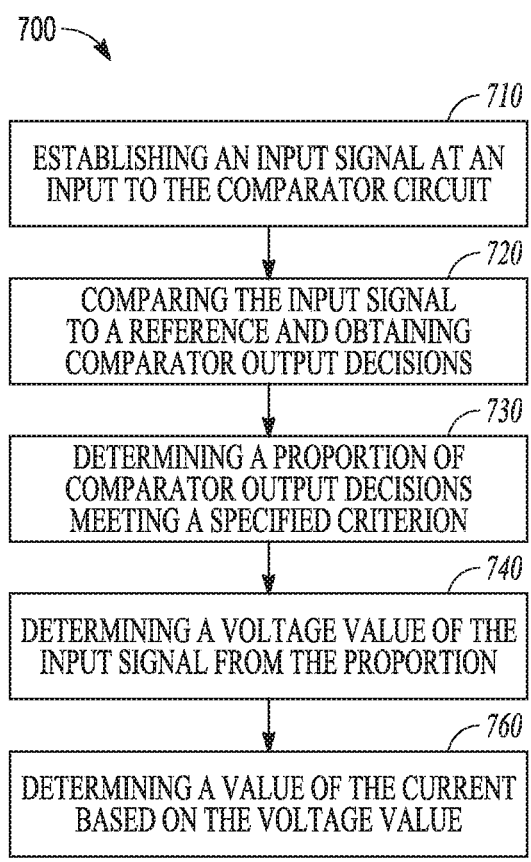
FIG. 7 shows an example of a method of measuring a leakage current of a circuit block using a probabilistic technique and a comparator.

FIG. 7 shows an example of a method 700 of measuring a leakage current of a circuit block using a probabilistic technique and a comparator. In some embodiments, the method 700 may use a probabilistic technique and a comparator circuit 610 as shown in FIG. 6 to measure a leakage current (such as a leakage current of a circuit block 640) for example.

At step 710, an input signal representative of the leakage current from a circuit block 640 may be established to input to the comparator 610. For example, the input signal representative of the leakage current may be a comparator input voltage Vin to input to the comparator circuit 610.

At step 720, the comparator circuit 610 may compare the established input signal to a specified reference for a specified count of trials, and thus may obtain a plurality of comparator output decisions corresponding to the specified count of trials. For example, the comparator circuit 610 may compare the Vin to a reference voltage Vref of the comparator 610 for a specified count (such as 100) of trials, and thus may obtain a plurality of comparator output decisions corresponding to the specified count of trials. For each comparison, when the Vin is greater than the Vref, the comparator output determination is supposed to be 1, and otherwise, when the Vin is less than the Vref, the comparator output determination is supposed to be zero.

At step 730, a proportion of comparator output decisions meeting a specified criterion is determined. In some embodiments, the specified criterion may be an indication that the input signal exceeds the specified reference. For example, the specified criterion may be an indication that the comparator input voltage Vin is greater that a reference voltage Vref.

For example, the comparator circuit 610 may do a specified count (e.g., 100) of comparisons between a comparator input voltage value Vin and the reference voltage Vref. The reference voltage Vref of the comparator 210 may be zero for example. Assuming, for the purposes of an example, that the comparator input voltage Vin at the signal input of the comparator 610 is on a similar order to the noise level Vn of the comparator 610, after completion of the specified count of comparisons by the comparator 610 between the Vin and the Vref, a proportion value P of the output decisions of the comparator 610 being ones may be determined by the control circuit 300. For example, a total number (e.g., 77) of success decisions being ones may be accumulated and recorded. Thus, the proportion value P (e.g., 0.77) of the output decisions of the comparator 610 being ones may be determined as a division of the total number (e.g., 77) of success decisions being ones by the specified count (e.g., 100) of comparisons.

At step 740, a voltage value of the input signal may be determined from the proportion. The voltage value corresponds to the leakage current.

For example, with a given proportion value P (e.g., 0.77) of the output decisions of the comparator 610 being ones, the value of the comparator input voltage Vin (~0.6 mV) may be determined from the proportion value P (e.g., 0.77) by using the CDF 400 of the comparator 610 having noise level Vn (e.g., 0.8 mV) as explained above. In another approach, with a given proportion value P (e.g., 0.77) of the output decisions of the comparator 610 being ones, the value of the comparator input voltage Vin (~0.6 mV) may be determined from the proportion value P (e.g., 0.77) by using the LUT 500 of the comparator 610.

At step 760, a value of the current may be determined based on the voltage value.

In an embodiment, as shown in FIG. 2, a value of the leakage current I from the circuit block 240 may be determined by a value of the Vin and the known resistance value R1 of a first current sensing element 220 according to the equation I=Vin/R1. Supposed that Vin=~0.6 mV, R1=0.5 kohm, then I=~1 µA.

In another embodiment, as shown in FIG. 6, a value of the leakage current I from the circuit block 640 may be determined by using two different values of the comparator input voltages Vin1 and Vin2 and the known resistance values R1 and R2 of the first and the second current sensing elements 220 and 225 according to the equation (8), that is I=(Vin1−Vin2)/(R1−R2). A detailed example of this way is given below.

In a first measurement, the switch K1 is set OFF and the switch K2 is set ON, and thus the Vin1 is established by the first current sensing element 220 (e.g., R1 of 0.5 kohm) to input to the comparator 610 with a noise level Vn (e.g., 0.8 mV). The comparator 610 may compare Vin1 with the Vref to obtain a specified count of trials (such as 100 times), then may obtain a plurality of comparator output decisions being ones, and thus may determine a proportion value P1 (e.g., 0.77) of the output decisions being ones for the specified count of trials. The value (e.g., ~0.6 mV) of Vin1 may be determined by using the CDF 400 of the comparator 610. Alternatively, the value of Vin1 may also be determined by using the LUT 500 of the comparator 610.

In a second measurement, the switch K1 is set ON and the switch K2 is set OFF, and thus the Vin2 is established by the second current sensing element 225 (e.g., R2 of 1 kohm) to input to the comparator 610. The comparator 610 may compare the Vin2 with the Vref for the specified count (such as 100) of trials, then may obtain a plurality of comparator output decisions being ones, and thus may determine a proportion value P2 (e.g., 0.92) of the output decisions being ones for the specified count of trials. The value (e.g., ~1.1 mV) of Vin2 may be determined by using the CDF 400 of the comparator 610. Alternatively, the value of Vin2 may also be determined by using the LUT 500 of the comparator 610.

For example, given R1=0.5 kohm, R2=1 kohm, Vin1=~0.6 mV, Vin2=~1.1 mV, then the value of the leakage current I from the circuit block 640 may be determined by using equation (8) to be (Vin1−Vin2)/(R1−R2)=~1 µA. In this way, the leakage current may be measured by using a relatively low-cost noisy comparator, without requiring use of an ADC and explicit reference voltage. As mentioned above, the approaches described herein may also reduce an impact of the offset Vos of the comparator on the accuracy of the leakage current measurement.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of measuring a leakage current of a circuit block using a probabilistic technique and a comparator circuit having a signal input terminal, a reference input terminal, and an output terminal, the method comprising:
    establishing an input signal representative of the leakage current at the signal input terminal to the comparator circuit;
    using the comparator circuit, comparing the input signal to a specified reference signal obtained at the reference input terminal and obtaining a plurality of comparator output signals corresponding to a specified count of trials at the output terminal, the plurality of comparator output signals each indicating a comparison result between the input signal and the reference signal;
determining a proportion of comparator output signals meeting a specified criterion for the specified count of trials;
determining a voltage value of the input signal from the proportion, the voltage value corresponding to the leakage current; and
transforming the voltage value into a leakage current value based on an impedance value of a current sensing element used to establish the input signal.

2. The method of claim 1, wherein the specified criterion comprises an indication that the input signal exceeds the specified reference.

3. The method of claim 1, wherein establishing the input signal at the comparator circuit includes switching the current through a first current sensing element for specified ones of the comparator output decisions, wherein a first voltage established at a first end of the first current sensing element is used as the input signal to the comparator circuit, and wherein a second voltage established at a second end of the first current sensing element is used as the specified reference of the comparator circuit.

4. The method of claim 3, wherein establishing the input signal at the comparator circuit further includes switching the current through an additional current sensing element for different specified ones of the comparator output decisions.

5. The method of claim 4, wherein the determining the proportion of the comparator output decisions meeting the specified criterion comprises:
determining a first proportion of comparator output decisions corresponding to the first current sensing element, and determining a corresponding first comparator input voltage value using the first proportion; and
determining a second proportion of the comparator output decisions corresponding to the additional current sensing element, and determining a corresponding second comparator input voltage value using the second proportion.

6. The method of claim 5, wherein the determining the value of the current based on the voltage value comprises determining an offset-corrected current value using the first comparator input voltage value, the second comparator input voltage value, an impedance value of the first current sensing element, and an impedance value of the additional current sensing element.

7. The method of claim 3, wherein the determining the value of the current based on the voltage value comprises determining the value of the current using the first comparator input voltage value and an impedance value of a first current sensing element.

8. The method of claim 1, wherein the determining the voltage value of the input signal from the proportion includes using data indicative of a distribution function of an input-referred noise voltage of the comparator.

9. The method of claim 1, wherein determining the voltage value of the input signal from the proportion includes using a look-up-table (LUT).

10. A leakage current measurement circuit arranged to use a probabilistic technique to determine a leakage current, the leakage current measurement circuit comprising:
a comparator means, having a signal input terminal, a reference input terminal and an output terminal, for comparing an input signal obtained at the signal input terminal to a specified reference signal obtained at the reference input terminal and obtaining a plurality of comparator output signals corresponding to a specified count of trials at the output terminal, the plurality of comparator output signals each indicating a comparison result between the input signal and the reference signal;
a first current sensing circuit means for establishing the input signal representative of the leakage current at the signal input terminal to a comparator means; and
a calculator configured to determine a proportion of comparator output decisions meeting a specified criterion for the specified count of trials, and to determine a voltage value of the input signal from the proportion, the voltage value corresponding to the leakage current, wherein the calculator is also configured to determine a value of the leakage current based on the voltage value, and wherein the voltage value is transformed into a leakage current value based on an impedance value of the first current sensing circuit means.

11. The current measurement circuit of claim 10, comprising a first switching means for switching the current through the first current sensing means for specified ones of the comparator output decisions, and a second switching means for switching the current through an additional current sensing means for different specified ones of the comparator output decisions.

12. The current measurement circuit of claim 10, wherein the calculator is also configured to determine a first proportion of comparator output decisions corresponding to the first current sensing means, and to determine a second proportion of the comparator output decisions corresponding to the additional current sensing means.

13. The current measurement circuit of claim 10, wherein the voltage value of the input signal is determined by using data indicative of a distribution function of an input-referred noise voltage of the comparator.

14. The current measurement circuit of claim 10, wherein the voltage value of the input signal is determined by using a look-up-table (LUT).

15. A leakage current measurement circuit arranged to use a probabilistic technique to determine a current, the current measurement circuit comprising:
a comparator circuit including a signal input terminal, a reference input terminal and an output terminal,
a first current sensing element coupled to the comparator circuit, the first current sensing element arranged to establish a first comparator input signal representative of the leakage current at the signal input terminal of the comparator circuit; and
a control circuit coupled to the comparator circuit, the control circuit configured to obtain from the output terminal of the comparator circuit a first plurality of comparator output signals corresponding to the first current sensing element for a specified count, the first plurality of comparator output signals each indicating a comparison result between the first comparator input signal at the signal input terminal and a reference signal at the reference signal terminal; determine a first proportion of comparator output signals meeting a specified criterion for the specified count of trials; and determine a first voltage value of the first comparator input signal from the first proportion, the first voltage value of the first comparator input signal corresponding to the leakage current, wherein the first voltage value is transformed into a leakage current value based on a first impedance value of the first resistor.

16. The current measurement circuit of claim 15, wherein the control circuit is configured to determine the leakage current value using the voltage value of the first comparator input signal and an impedance value of the first current sensing element.

17. The current measurement circuit of claim 15, further comprising a storage to store data indicative of a distribution function of an input-referred noise voltage of the comparator that is used to determine the voltage value of the first comparator input signal from the proportion.

18. The current measurement circuit of claim 15, further comprising a look-up-table (LUT) to determine the voltage value of the first comparator input signal from the proportion.

19. The current measurement circuit of claim 15, further comprising:
   a first switch to switch the current through the first current sensing element for specified ones of the comparator output decisions; and
   a second switch to switch the current through an additional current sensing element for different specified ones of the comparator output decisions, wherein the additional current sensing element is coupled to the comparator circuit, arranged to establish a second comparator input voltage representative of the leakage current at the signal input terminal of the comparator circuit.

20. The current measurement circuit of claim 19, wherein the control circuit is configured to obtain a second plurality of comparator output decisions corresponding to the additional current sensing element for the specified count, determine a second proportion of comparator output decisions meeting the specified criterion, and determine a second voltage value of the second comparator input signal from the second proportion, the second voltage value of the second comparator input signal corresponding to the current.

21. The current measurement circuit of claim 20, wherein the control circuit is configured to determine an offset-corrected current value using the first voltage value of the first comparator input signal, the second voltage value of the second comparator input signal, the first impedance value of the first current sensing element, and a second impedance value of the additional current sensing element.

22. The current measurement circuit of claim 15, wherein the current comprises a leakage current from a circuit block.

23. The current measurement circuit of claim 22, wherein the first and the additional current sensing elements are in series with the circuit block.

24. The current measurement circuit of claim 22, wherein the first and the additional current sensing elements are arranged on a ground side or a supply voltage (VDD) side of the circuit block.

25. The current measurement circuit of claim 15, further comprising one or more additional comparator circuits in parallel with the comparator circuit.

26. The current measurement circuit of claim 20, wherein the control circuit is configured to determine an offset-corrected current value as a division of a voltage value difference between the first and the second voltage values and an impedance value difference between the first and the additional current sensing elements.

* * * * *